United States Patent
Wang et al.

(10) Patent No.: US 12,051,597 B2
(45) Date of Patent: Jul. 30, 2024

(54) MATERIAL SUPPLY SYSTEM AND MATERIAL SUPPLY METHOD

(71) Applicant: CHANGXIN MEMORY TECHNOLOGIES, INC., Hefei (CN)

(72) Inventors: Zhiguo Wang, Hefei (CN); Lei Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 284 days.

(21) Appl. No.: 17/441,672

(22) PCT Filed: Jun. 8, 2021

(86) PCT No.: PCT/CN2021/098970
§ 371 (c)(1),
(2) Date: Sep. 21, 2021

(87) PCT Pub. No.: WO2022/048225
PCT Pub. Date: Mar. 10, 2022

(65) Prior Publication Data
US 2023/0062480 A1 Mar. 2, 2023

(30) Foreign Application Priority Data
Sep. 3, 2020 (CN) .......................... 202010914701.1

(51) Int. Cl.
*H01L 21/67* (2006.01)
(52) U.S. Cl.
CPC .............................. *H01L 21/67023* (2013.01)
(58) Field of Classification Search
CPC .................. H01L 21/67023; F17C 2205/0142
See application file for complete search history.

(56) References Cited

U.S. PATENT DOCUMENTS
2007/0269207 A1 11/2007 Minamida et al.

FOREIGN PATENT DOCUMENTS
CN  101722120 A  6/2010
CN  104186096 A  12/2014
(Continued)

OTHER PUBLICATIONS

Original and Translation of CN 109268687 A; Luo Jian, Zhu Bin, Ruan Mengyu; Jan. 25, 2019.*

(Continued)

*Primary Examiner* — Paul J Gray
(74) *Attorney, Agent, or Firm* — Kilpatrick Townsend & Stockton LLP

(57) ABSTRACT

The present disclosure relates to the field of semiconductor technology, and proposes a material supply system and a material supply method. The material supply system includes a storage device, a gas channel and a material channel, wherein the storage device comprises a first storage tank and a second storage tank that are independently disposed, and both the first storage tank and the second storage tank are used to store a supply material; the gas channel is connected to the first storage tank, the gas channel is connected to the second storage tank, and the gas channel is used to feed gas; and the material channel is connected to the first storage tank or the second storage tank in a switchable manner to receive the supply material discharged from the first storage tank or the second storage tank.

8 Claims, 2 Drawing Sheets

(56) References Cited

FOREIGN PATENT DOCUMENTS

| | | |
|---|---|---|
| CN | 109037119 A | 12/2018 |
| CN | 109268687 A | 1/2019 |
| CN | 212617648 U | 2/2021 |
| TW | 519126 U | 1/2003 |

OTHER PUBLICATIONS

International Search Report cited in PCT/CN2021/098970 mailed Sep. 9, 2021, 11 pages.

* cited by examiner

MATERIAL SUPPLY SYSTEM AND MATERIAL SUPPLY METHOD

CROSS-REFERENCE TO RELATED APPLICATIONS

The present disclosure is a national stage entry of International Patent Application No. PCT/CN2021/098970, filed on Jun. 8, 2021, which claims the priority to Chinese Patent Application 202010914701.1, filed on Sep. 3, 2020, both titled "MATERIAL SUPPLY SYSTEM AND MATERIAL SUPPLY METHOD". International Patent Application No. PCT/CN2021/098970 and Chinese Patent Application 202010914701.1 are incorporated herein by reference in their entireties.

TECHNICAL FIELD

The present disclosure relates to the field of semiconductor technology, and in particular, to a material supply system and a material supply method.

BACKGROUND

In the field of semiconductor technology, many different types of consumables, especially liquid chemical materials, are usually used in the semiconductor manufacturing process.

In related technologies, nitrogen is often used to press a supply material out of a bucket. The entire process needs to exhaust the supply material in one bucket, and then the bucket is replaced. Accordingly, the pressure holding time of the bucket is relatively long, which easily leads to nitrogen dissolution.

SUMMARY

According to the first aspect of the present disclosure, a material supply system is provided, comprising:
- a storage device, wherein the storage device comprises a first storage tank and a second storage tank that are independently disposed, and both the first storage tank and the second storage tank are used to store a supply material;
- a gas channel, wherein the gas channel is connected to the first storage tank, the gas channel is connected to the second storage tank, and the gas channel is used to feed gas; and
- a material channel, wherein the material channel is connected to the first storage tank or the second storage tank in a switchable manner to receive the supply material discharged from the first storage tank or the second storage tank.

According to the second aspect of the present disclosure, a material supply method is provided, comprising:
- feeding gas to a first storage tank or a second storage tank through a gas channel, so that a supply material in the first storage tank or the second storage tank is fed into a material channel;
- wherein, the material channel is connected to the first storage tank or the second storage tank in a switchable manner.

The material supply system of the present disclosure can implement material supply through the storage device, the gas channel and the material channel. Specifically, the supply material is pressed into the material channel by means of the gas fed from the gas channel, and the material channel implements the material supply. Since the material channel is connected to the first storage tank or the second storage tank in a switchable manner, the material channel can be frequently switched to connect with the first storage tank or the second storage tank during the material supply, that is, the pressure holding time of the gas in the first storage tank or the second storage tank is reduced, thereby avoiding gas dissolution into the supply material.

BRIEF DESCRIPTION OF THE DRAWINGS

By considering the following detailed description of the preferred embodiments of the present disclosure in conjunction with the accompanying drawings, various objectives, features and advantages of the present disclosure will become more apparent. The drawings are only exemplary illustrations of the present disclosure, and are not necessarily drawn to scale. In the drawings, the same reference numerals always refer to the same or similar parts. In the figures.

DETAILED DESCRIPTION

Figure 1:
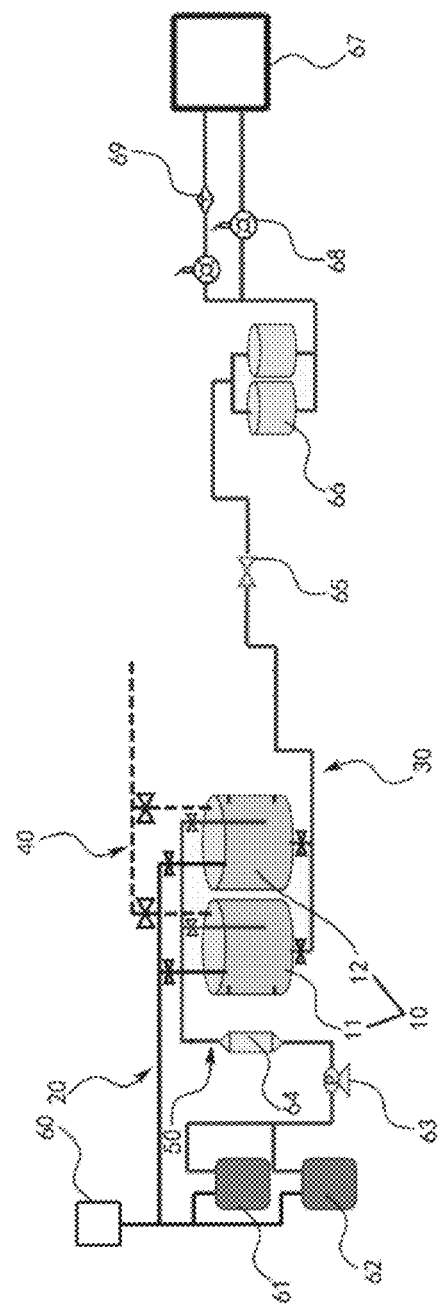
FIG. 1 is a schematic structure diagram showing a material supply system according to an exemplary embodiment.

Typical embodiments embodying the features and advantages of the present disclosure will be described in detail below. It should be understood that the present disclosure can have various variations in different embodiments without departing from the scope of the present disclosure, and the description and drawings therein are essentially for illustrative purposes, rather than limiting the present disclosure.

In the following description of different exemplary embodiments of the present disclosure, reference is made to the accompanying drawings. The drawings form a part of the present disclosure, and show different exemplary structures, systems, and steps that can implement various aspects of the present disclosure by way of examples. It should be understood that other specific solutions of components, structures, exemplary devices, systems, and steps can be used, and structural and functional modifications can be made without departing from the scope of the present disclosure. Moreover, although the terms "above", "between", "within", etc. can be used in this specification to describe different exemplary features and elements of the present disclosure, these terms are used herein for convenience only, such as exemplary directions in the drawings. Nothing in this specification should be understood as requiring a specific three-dimensional direction of the structure to fall within the scope of the present disclosure.

Figure 2:
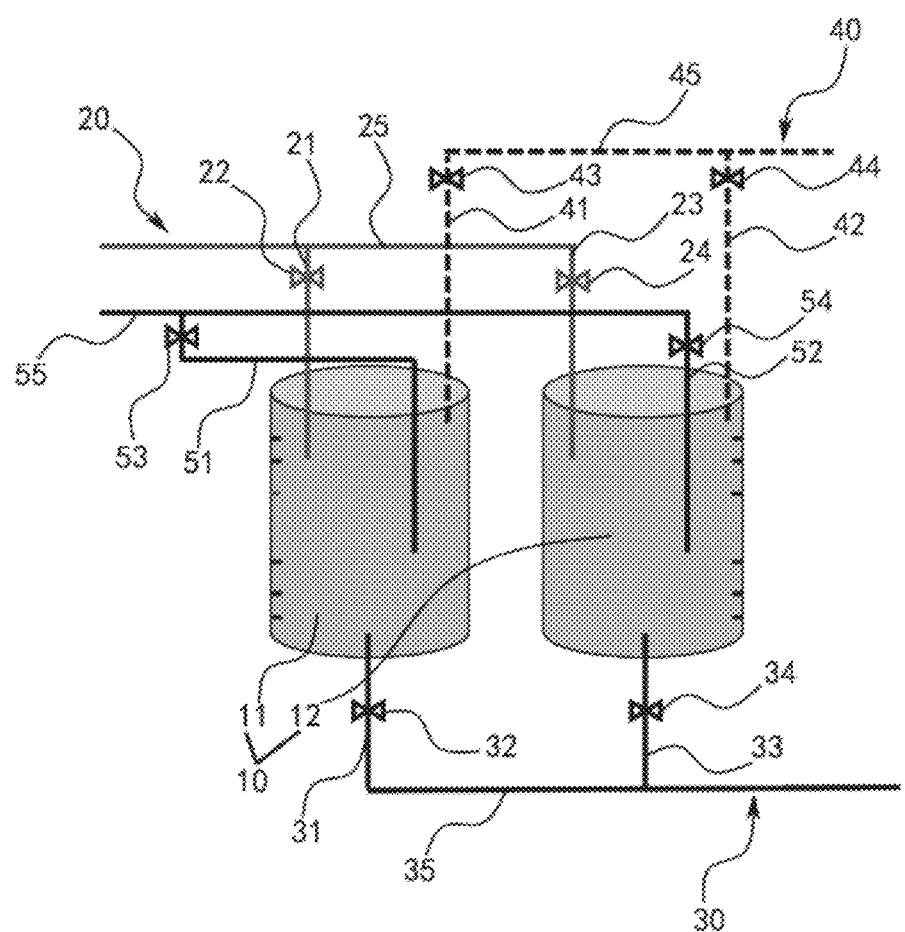
FIG. 2 is a partial schematic structure diagram showing a material supply system according to an exemplary embodiment.

An embodiment of the present disclosure provides a material supply system. Referring to FIGS. 1 and 2, the material supply system comprises: a storage device 10, wherein the storage device 10 comprises a first storage tank 11 and a second storage tank 12 that are independently disposed, and both the first storage tank 11 and the second storage tank 12 are used to store a supply material; a gas channel 20, wherein the gas channel 20 is connected to the first storage tank 11, the gas channel 20 is connected to the second storage tank 12, and the gas channel 20 is used to feed gas; and a material channel 30, wherein the material channel 30 is connected to the first storage tank 11 or the second storage tank 12 in a switchable manner to receive the supply material discharged from the first storage tank 11 or the second storage tank 12.

The material supply system according to an embodiment of the present disclosure can implement material supply through the storage device 10, the gas channel 20 and the material channel 30. Specifically, the supply material is pressed into the material channel 30 by means of the gas fed from the gas channel 20, and the material channel 30 implements the material supply. Since the material channel 30 is connected to the first storage tank 11 or the second storage tank 12 in a switchable manner, the material channel 30 can be frequently switched to connect with the first storage tank 11 or the second storage tank 12 during the material supply, that is, the pressure holding time of the gas in the first storage tank 11 or the second storage tank 12 is reduced, thereby avoiding gas dissolution into the supply material.

It should be noted that, compared with the related technology in which a bucket is replaced with a new one after the supply material therein is completely used, the first storage tank 11 and the second storage tank 12 in this embodiment can be switched to reduce the pressure holding time in the first storage tank 11 and the second storage tank 12, thereby effectively avoiding gas dissolution into the supply material. In addition, the material can be uninterruptedly supplied in the presence of the first storage tank 11 and the second storage tank 12, and the material supply will not be stopped due to the replacement of the bucket.

In one embodiment, as shown in FIG. 1, the material supply system further comprises a gas source 60, the gas channel 20 is connected to the gas source 60, the gas source 60 may contain nitrogen, and the gas source 60 delivers the nitrogen to the first storage tank 11 and the second storage tank 12 through the gas channel 20, wherein the gas pressure in the gas channel 20 is 2.5 kgf/cm$^2$ to 3.0 kgf/cm$^2$. The gas pressure in this range can effectively reduce gas dissolution into the supply material, thereby reducing the probability of bubbles in the supply material.

In one embodiment, as shown in FIG. 1, the material channel 30 is connected to a receiving part 67, that is, the material channel 30 feeds the supply material therein to the receiving part 67. The receiving part 67 can be a nozzle, a solvent bath, a container to be handled, etc., that is, the supply material can be a chemical material for cleaning, or a process auxiliary material such as a photoresist.

In one embodiment, the first storage tank 11 and the second storage tank 12 can be two independent buckets, or two independent storage spaces in one bucket.

In one embodiment, as shown in FIG. 2, the gas channel 20 comprises: a first gas input pipeline 21, wherein the first gas input pipeline 21 is connected to the first storage tank 11, and a first valve 22 is arranged on the first gas input pipeline 21; and a second gas input pipeline 23, wherein the second gas input pipeline 23 is connected to the second storage tank 12, and a second valve 24 is arranged on the second gas input pipeline 23.

The first gas input pipeline 21 and the second gas input pipeline 23 are respectively used to feed gas to the first storage tank 11 and the second storage tank 12, and the first valve 22 and the second valve 24 are respectively used to control the connection and disconnection of the first gas input pipeline 21 and the second gas input pipeline 23, so as to control whether to feed gas to the first storage tank 11 and the second storage tank 12.

Specifically, the first valve 22 and the second valve 24 can be mechanical valves or electronic valves, as long as they can control the connection and disconnection of the pipelines. Relevant valves in related technologies can be used, such as traditional stop valves.

It should be noted that the first gas input pipeline 21 and the second gas input pipeline 23 can be respectively connected to a gas source 60, that is, to achieve independent gas supply, or they can share a gas source 60, the gas is controlled by the first valve 22 and the second valve 24 to be fed to the first storage tank 11 or the second storage tank 12, and the gas can also be fed to the first storage tank 11 and the second storage tank 12 at the same time.

In one embodiment, as shown in FIGS. 1 and 2, the gas channel 20 further comprises: a main gas input pipeline 25, wherein the main gas input pipeline 25 is connected to the first gas input pipeline 21, the main gas input pipeline 25 is connected to the second gas input pipeline 23, and the main gas input pipeline 25 is connected to the gas source 60, thereby reducing the use of pipelines and sharing the gas channel.

In one embodiment, as shown in FIG. 2, the material channel 30 comprises: a first material output pipeline 31, wherein the first material output pipeline 31 is connected to the first storage tank 11, and a third valve 32 is arranged on the first material output pipeline 31; and a second material output pipeline 33, wherein the second material output pipeline 33 is connected to the second storage tank 12, and a fourth valve 34 is arranged on the second material output pipeline 33.

The first material output pipeline 31 and the second material output pipeline 33 are respectively used to receive the supply material discharged from the first storage tank 11 and the second storage tank 12, and the third valve 32 and the fourth valve 34 are respectively used to control the connection and disconnection of the first material output pipeline 31 and the second material output pipeline 33, so as to control the first storage tank 11 or the second storage tank 12 to supply the material and interrupt the supply.

Specifically, the third valve 32 and the fourth valve 34 can be manually controlled mechanical valves, such as common needle valves, stop valves, gate valves, plug valves, ball valves or butterfly valves, or automatically controlled electronic valves, such as solenoid valves or electronic valves with sensors.

In one embodiment, as shown in FIGS. 1 and 2, the material channel 30 further comprises: a main material output pipeline 35, wherein the main material output pipeline 35 is connected to the first material output pipeline 31, the main material output pipeline 35 is connected to the second material output pipeline 33, and the main material output pipeline 35 is connected to the receiving part 67, which realizes switchable material supply of the first storage tank 11 and the second storage tank 12.

In one embodiment, the first material output pipeline 31 and the second material output pipeline 33 are respectively connected to the bottoms of the first storage tank 11 and the second storage tank 12 to facilitate discharging.

In one embodiment, as shown in FIG. 1, a ninth valve 65, second pumps 66, flow meters 68 and second filters 69 can be arranged on the main material output pipeline 35. The two second pumps 66, the two flow meters 68, and the two second filters 69 are respectively arranged in parallel, that is, the main material output pipeline 35 has two final output ends, which can be connected to the same receiving part 67 or connected to two receiving parts 67 respectively. Of course, the main material output pipeline 35 can also have one or more than two final output ends, which are not limited here and can be selected according to actual needs.

In one embodiment, as shown in FIGS. 1 and 2, the material supply system further comprises: an exhaust channel 40, wherein the exhaust channel 40 comprises a first exhaust pipeline 41 and a second exhaust pipeline 42, and the first exhaust pipeline 41 and the second exhaust pipeline 42 are respectively connected to the first storage tank 11 and the second storage tank 12. The exhaust channel 40 is used to release the gas in the first storage tank 11 and the second storage tank 12, so as to avoid the dissolution of gas in the idle first storage tank 11 or second storage tank 12 into the supply material, thereby avoiding bubbles.

It should be noted that when the first storage tank 11 supplies the material, the second storage tank 12 is idle. Correspondingly, when the second storage tank 12 supplies the material, the first storage tank 11 is idle.

In one embodiment, as shown in FIG. 2, a fifth valve 43 is arranged on the first exhaust pipeline 41, and a sixth valve 44 is arranged on the second exhaust pipeline 42. The fifth valve 43 and the sixth valve 44 are respectively used to control the connection and disconnection of the first exhaust pipeline 41 and the second exhaust pipeline 42, so as to release the gas in the first storage tank 11 or the second storage tank 12.

The first exhaust pipeline 41 and the second exhaust pipeline 42 are respectively used to release the gas in the first storage tank 11 and the second storage tank 12, and the fifth valve 43 and the sixth valve 44 are respectively used to control the connection and disconnection of the first exhaust pipeline 41 and the second exhaust pipeline 42, so as to control whether to release the gas in the first storage tank 11 and the second storage tank 12.

Specifically, the fifth valve 43 and the sixth valve 44 can be mechanical valves or electronic valves, as long as they can control the connection and disconnection of the pipelines. Relevant valves in related technologies can be used, such as traditional stop valves.

It should be noted that the first exhaust pipeline 41 and the second exhaust pipeline 42 can be two independent exhaust pipes.

In one embodiment, as shown in FIGS. 1 and 2, the material supply system further comprises: a main exhaust pipeline 45, wherein the main exhaust pipeline 45 is connected to the first exhaust pipeline 41, and the main exhaust pipeline 45 is connected to the second exhaust pipeline 42.

In one embodiment, as shown in FIGS. 1 and 2, the material supply system further comprises: a liquid supplement channel 50, wherein the liquid supplement channel 50 comprises a first liquid supplement pipeline 51 and a second liquid supplement pipeline 52, and the first liquid supplement pipeline 51 and the second liquid supplement pipeline 52 are respectively connected to the first storage tank 11 and the second storage tank 12. The liquid supplement channel 50 can be configured to supplement the first storage tank 11 and the second storage tank 12 in time when the supply material in the first storage tank 11 and the second storage tank 12 is insufficient.

In one embodiment, as shown in FIG. 1, the material supply system further comprises a first liquid supplement part 61 and a second liquid supplement part 62, the first liquid supplement part 61 and the second liquid supplement part 62 are connected to the first storage tank 11 and the second storage tank 12 through the liquid supplement channel 50, and the first liquid supplement part 61 and the second liquid supplement part 62 are used to store the supply material, so as to supplement liquid to the first storage tank 11 and the second storage tank 12. A first pump 63 and a first filter 64 are arranged on the liquid supplement channel 50, the first liquid supplement part 61 and the second liquid supplement part 62 are independently disposed, the first pump 63 is used to pump the supply material of the first liquid supplement part 61 or the second liquid supplement part 62 into the first storage tank 11 or the second storage tank 12, and the first filter 64 is used for filtering, so as to ensure the cleanliness of the supply material.

Specifically, the gas source 60 is connected to the first liquid supplement part 61 and the second liquid supplement part 62 by pipelines, that is, the gas source 60 is used to press the supply material in the first liquid supplement part 61 and the second liquid supplement part 62 into the liquid supplement channel 50. The first storage tank 11, the second storage tank 12, the first liquid supplement part 61 and the second liquid supplement part 62 can share one gas source 60, which can be achieved by controlling the connection or disconnection of the pipelines through the valves.

In one embodiment, as shown in FIG. 2, a seventh valve 53 is arranged on the first liquid supplement pipeline 51, and an eighth valve 54 is arranged on the second liquid supplement pipeline 52.

The first liquid supplement pipeline 51 and the second liquid supplement pipeline 52 are respectively used to feed the supply material to the first storage tank 11 and the second storage tank 12, and the seventh valve 53 and the eighth valve 54 are respectively used to control the connection and disconnection of the first liquid supplement pipeline 51 and the second liquid supplement pipeline 52, so as to control the supplement of the supply material to the first storage tank 11 or the second storage tank 12.

Specifically, the seventh valve 53 and the eighth valve 54 can be manually controlled mechanical valves, such as common needle valves, stop valves, gate valves, plug valves, ball valves or butterfly valves, or automatically controlled electronic valves, such as solenoid valves or electronic valves with sensors.

In one embodiment, as shown in FIG. 2, the liquid supplement channel 50 further comprises: a main liquid supplement pipeline 55, wherein the main liquid supplement pipeline 55 is connected to the first liquid supplement pipeline 51, and the main liquid supplement pipeline 55 is connected to the second liquid supplement pipeline 52.

In one embodiment, the material supply system further comprises: a detection part, which is used to determine remaining quantity information of the supply material in the first storage tank 11 and the second storage tank 12; and a control part, which is connected to the detection part to obtain the remaining quantity information through the detection part, and controls the material channel 30 according to the remaining quantity information to be switched to connect with the first storage tank 11 or the second storage tank 12.

It should be noted that the detection part can be a photoelectric sensor, and the detection part comprises a sending end arranged on one side of the first storage tank 11 and a receiving end arranged on the other side of the first storage tank 11, wherein the sending end is arranged opposite to the receiving end to monitor whether there is the supply material in the first storage tank 11, that is, after the use quantity of the supply material reaches a detection standard, the remaining quantity of the supply material in the first storage tank 11 can be determined, and the detected remaining quantity is a standard value. When a plurality of detection parts are arranged in the height direction of the first storage tank 11, a plurality of standard values can be sequentially obtained. Correspondingly, the method for detecting the remaining quantity of the supply material in the second storage tank 12 is also the same.

Alternatively, the detection part can also be a flow meter, which is arranged on the first material output pipeline 31 to determine the supply material flowing out of the first storage tank 11 by the flow rate, so as to determine the remaining quantity of the supply material in the first storage tank 11. Correspondingly, the method for determining the remaining quantity of the supply material in the second storage tank 12 is also the same.

Alternatively, the detection part is configured as a gravity sensor, which measures the weight of the first storage tank 11 to determine the remaining quantity of the supply material in the first storage tank 11. Correspondingly, the method for obtaining the remaining quantity of the supply material in the second storage tank 12 is also the same.

The detection part can also be configured to determine when the first storage tank 11 and the second storage tank 12 are supplemented with the material.

Specifically, the connection between the material channel 30 and the first storage tank 11 or the second storage tank 12 is controlled by the third valve 32 and the fourth valve 34 on the first material output pipeline 31 and on the second material output pipeline 33, that is, the control part directly controls the opening and closing of the third valve 32 and the fourth valve 34 to realize the connection of the first material output pipeline 31 or the second material output pipeline 33, so as to realize material supply of the first storage tank 11 or the second storage tank 12. The third valve 32 and the fourth valve 34 can be electronic valves.

It should be noted that the control part can also control the connection and disconnection of the first gas input pipeline 21 and the second gas input pipeline 23 by controlling the opening and closing of the first valve 22 and the second valve 24. The control part can also control the connection and disconnection of the first exhaust pipeline 41 and the second exhaust pipeline 42 by controlling the opening and closing of the fifth valve 43 and the sixth valve 44. In addition, the control part can also control the connection and disconnection of the first liquid supplement pipeline 51 and the second liquid supplement pipeline 52 by controlling the opening and closing of the seventh valve 53 and the eighth valve 54.

It should be noted that the control part can be a control center of the entire material supply, and can control the opening and closing of each valve.

In one embodiment, the supply material can be chemicals compressed with nitrogen, such as a developer, a photoresist, a diluent, a cleaning agent, etc.

For example, nitrogen is injected into the storage device 10 to generate pressure, and the supply material is transferred to a machine side (which can be understood as the location of the receiving part 67) by means of the pressure. When the pressure of the nitrogen is adjusted to 2.5 kgf/cm$^2$ to 3.0 kgf/cm$^2$, not only can the phenomenon of nitrogen dissolution be improved, that is, the probability of bubble generation is greatly reduced (compared with the nitrogen pressure at 4.0 kgf/cm$^2$, the probability of bubble generation is reduced by 60%), but also there is also enough pressure to smoothly transfer the supply material to the machine side.

The storage device 10 comprises the first storage tank 11 and the second storage tank 12 that are independently disposed. After the height of the supply material in the first storage tank 11 is lower than a set height, the second storage tank 12 can be automatically switched for supply to fill the supply material in the first storage tank 11, which realizes frequent replacement of the supply material in the first storage tank 11 or the second storage tank 12, so that the standing time of the supply material is shortened, and the filling frequency is increased. The flowing filled supply material drives the stationary supply material to expel 40% of bubbles (when the set height is adjusted from 40% of the total capacity to 60% of the total capacity), so as to improve the phenomenon of nitrogen dissolution.

The first storage tank 11 and the second storage tank 12 can be switched for continuous supply, so as to achieve uninterrupted supply. When the first storage tank 11 or the second storage tank 12 is idle, the pressure in the idle one is released to avoid nitrogen dissolution in the idle storage tank, so that the probability of bubble generation is 0%.

An embodiment of the present disclosure further provides a material supply method, comprising: feeding gas to the first storage tank 11 or the second storage tank 12 through the gas channel 20, so that the supply material in the first storage tank 11 or the second storage tank 12 is fed into the material channel 30; wherein, the material channel 30 is connected to the first storage tank 11 or the second storage tank 12 in a switchable manner.

In the material supply method according to the embodiment of the present disclosure, the supply material is pressed into the material channel 30 by means of the gas fed from the gas channel 20, and the material channel 30 implements material supply. In addition, the material channel 30 can be frequently switched to connect with the first storage tank 11 or the second storage tank 12 during the material supply, that is, the pressure holding time of the gas in the first storage tank 11 or the second storage tank 12 is reduced, thereby avoiding gas dissolution into the supply material.

It should be noted that the material channel 30 can be switched to connect with the first storage tank 11 or the second storage tank 12 according to a preset rule.

The preset rule can be determined according to a pressure holding time, that is, a pressure holding time of the first storage tank 11 and a pressure holding time of the second storage tank 12 are set, for example, the pressure holding time of the first storage tank 11 is set as a first time, the pressure holding time of the second storage tank 12 is set as a second time, the first storage tank 11 that continuously supplies the material for the first time is switched to the second storage tank 12 to start material supply, the second storage tank 12 that continuously supplies the material for the second time is switched to the first storage tank 11 to start material supply, and so on. The first time and the second time are not greater than 8 hours, and the first time and the second time can be equal or unequal.

The preset rule can also be determined according to a supply quantity, that is, supply quantities of the first storage tank 11 and supply quantities of the second storage tank 12 are set, for example, the supply quantity of the first storage tank 11 is a first supply quantity, the supply quantity of the second storage tank 12 is a second supply quantity, the first storage tank 11 that continuously supplies the material for the first supply quantity is switched to the second storage tank 12 to start material supply, the second storage tank 12 that continuously supplies the material for the second supply quantity is switched to the first storage tank 11 to start material supply, and so on. The first supply quantity and the second supply quantity can be equal or unequal.

The preset rule can also be determined according to a set value of a supplement quantity, that is, remaining quantities of the supply material supplemented to the first storage tank 11 and the second storage tank 12 are set, for example, the remaining quantity supplement value of the first storage tank 11 is a first remaining quantity, and the remaining quantity supplement value of the second storage tank 12 is a second remaining quantity; when the supply material in the first storage tank 11 reaches the first remaining quantity, the supply material needs to be supplemented, and the first storage tank 11 is switched to the second storage tank 12 to start material supply; when the supply material in the second storage tank 12 reaches the second remaining quantity, the supply material needs to be supplemented, and the second storage tank 12 is switched to the first storage tank 11 to start material supply; and so on.

In one embodiment, when the supply material in the first storage tank 11 is continuously used for a first preset value, the material channel 30 is switched to connect with the second storage tank 12, and when the supply material in the second storage tank 12 is continuously used for a second preset value, the material channel 30 is switched to connect with the first storage tank 11; wherein, the first preset value is not greater than one sixth of the total capacity of the first storage tank 11, and the second preset value is not greater than one sixth of the total capacity of the second storage tank 12.

Specifically, for example, the first storage tank 11 and the second storage tank 12 are both 600 L, then when the supply material in the first storage tank 11 is continuously used for 100 L, the material channel 30 is switched to connect with the second storage tank 12, and when the second storage tank 12 starts to supply material, and when the supply material in the second storage tank 12 is continuously used for 100 L, the material channel 30 is switched to connect with the first storage tank 11, and so on.

In one embodiment, the gas pressure in the gas channel 20 is 2.5 kgf/cm$^2$ to 3.0 kgf/cm$^2$, so that the probability of bubble generation can be greatly reduced, and there is enough pressure to feed the supply material into the material channel 30.

In one embodiment, the material supply method further comprises: supplementing the supply material to the first storage tank 11 or the second storage tank 12 through the liquid supplement channel 50; wherein, when the supply material in the first storage tank 11 is at a third preset value, the material channel 30 is switched to connect with the second storage tank 12, and the first storage tank 11 starts to be supplemented with the supply material; and when the supply material in the second storage tank 12 is at a fourth preset value, the material channel 30 is switched to connect with the first storage tank 11, and the second storage tank 12 starts to be supplemented with the supply material.

Specifically, when the supply material in the first storage tank 11 or the second storage tank 12 is insufficient, the material needs to be supplemented in time. At this time, the storage tank that needs to supplemented with the supply material stops material supply and is switched to the other for material supply.

For example, the first storage tank 11 and the second storage tank 12 are both 600 L, then when the supply material in the first storage tank 11 remains 360 L, the material channel 30 is switched to connect with the second storage tank 12, the second storage tank 12 starts material supply, and the first storage tank 11 is supplemented with the supply material; when the supply material in the second storage tank 12 remains 360 L, the material channel 30 is switched to connect with the first storage tank 11, the first storage tank 11 starts material supply, and the second storage tank 12 is supplemented with the supply material; and so on.

It should be noted that the priority of supplement of the supply material is greater than that of continuous use of the supply material, that is, when the continuous use quantity of the supply material does not reach the preset value, but the remaining quantity of the supply material reaches the supplement value, the switching is required and the supplement needs to be completed.

Alternatively, the priority of supplement of the supply material is smaller than that of continuous use of the supply material, that is, when the continuous use quantity of the supply material does not reach the preset value, although the remaining quantity of the supply material reaches the supplement value, the material supply is still required and the material is supplemented when the material supply is completed.

In one embodiment, when the supply material in the first storage tank 11 is supplemented to a fifth preset value, the feeding of gas into first storage tank 11 is stopped, and the gas in the first storage tank 11 is released through the exhaust channel 40; or, when the supply material in the second storage tank 12 is supplemented to a sixth preset value, the feeding of gas into second storage tank 12 is stopped, and the gas in the second storage tank 12 is released through the exhaust channel 40.

Specifically, the gas may not be released when the supply material is supplemented, but released after the supply material is supplemented.

Alternatively, the feeding of gas is stopped and the release of gas starts when the supply material is supplemented. In one embodiment, the material supply method further comprises: supplementing the supply material to the first storage tank 11 or the second storage tank 12 through the liquid supplement channel 50; wherein, when the supply material in the first storage tank 11 is at the third preset value, the material channel 30 is switched to connect with the second storage tank 12, the feeding of gas into the first storage tank 11 is stopped, the gas in the first storage tank 11 is released through the exhaust channel 40, and the first storage tank 11 starts to be supplemented with the supply material; and when the supply material in the second storage tank 12 is at the fourth preset value, the material channel 30 is switched to connect with the first storage tank 11, the feeding of gas into the second storage tank 12 is stopped, the gas in the second storage tank 12 is released through the exhaust channel 40, and the second storage tank 12 starts to be supplemented with the supply material.

It should be noted that the fifth preset value and the sixth preset value are less than the maximum capacities of the first storage tank 11 and the second storage tank 12.

In one embodiment, the material supply method further comprises: replacing the first storage tank 11 or the second storage tank 12; wherein, when the supply material in the first storage tank 11 is at the third preset value, the material channel 30 is switched to connect with the second storage tank 12, and the first storage tank 11 is replaced; and when the supply material in the second storage tank 12 is at the fourth preset value, the material channel 30 is switched to connect with the first storage tank 11, and the second storage tank 12 is replaced.

When the supply material in the first storage tank 11 or the second storage tank 12 is insufficient, the first storage tank 11 or the second storage tank 12 is directly replaced with a new one, which is different from the above-mentioned supplement of the supply material.

In one embodiment, the third preset value is not less than three fifths of the total capacity of the first storage tank 11, and the fourth preset value is not less than three fifths of the total capacity of the second storage tank 12.

In one embodiment, the material supply method further comprises: releasing the gas in the first storage tank 11 or the second storage tank 12 through the exhaust channel 40; wherein, when the material channel 30 is switched to connect with the second storage tank 12, the feeding of gas into the first storage tank 11 is stopped, and the gas in the first storage tank 11 is released through the exhaust channel 40; and when the material channel 30 is switched to connect with the first storage tank 11, the feeding of gas into the second storage tank 12 is stopped, and the gas in the second storage tank 12 is released through the exhaust channel 40.

When the material is supplied by the first storage tank 11 and the second storage tank 12 is idle, the pressure in the second storage tank 12 can be released, so as to avoid the phenomenon of gas dissolution into the supply material. Correspondingly, when the material is supplied by the second storage tank 12 and the first storage tank 11 is idle, the pressure in the first storage tank 11 can be released.

In one embodiment, the material supply method is applicable to the above-mentioned material supply system.

A person skilled in the art would readily conceive of other embodiments of the present disclosure after considering the specification and practicing the invention disclosed herein. The present disclosure is intended to cover any variations, uses or adaptive changes of the present disclosure. These variations, uses or adaptive changes follow the general principle of the present disclosure and comprise common general knowledge or conventional technical means in the technical field that are not disclosed in the present disclosure. The specification and the example embodiments are merely regarded as illustrative, and the real scope and spirit of the present disclosure are indicated by the preceding claims.

It should be understood that the present disclosure is not limited to the precise structure described above and shown in the drawings, and various modifications and changes can be made without departing from its scope. The scope of the present disclosure is only limited by the appended claims.

The invention claimed is:

1. A material supply system, comprising:
    a storage device, wherein the storage device comprises a first storage tank and a second storage tank that are independently disposed, and both the first storage tank and the second storage tank are used to store a supply material;
    a gas channel, wherein the gas channel is connected to the first storage tank, the gas channel is connected to the second storage tank, and the gas channel is used to feed gas;
    a material channel, wherein the material channel is connected to the first storage tank or the second storage tank in a switchable manner to receive the supply material discharged from the first storage tank or the second storage tank; and
        a first liquid supplement part and a second liquid supplement part, the first liquid supplement part and the second liquid supplement part are connected to the first storage tank and the second storage tank, and the first liquid supplement part and the second liquid supplement part are independently disposed;
    wherein the material channel comprises:
        a first material output pipeline, wherein the first material output pipeline is connected to the first storage tank, and a third valve is arranged on the first material output pipeline;
        a second material output pipeline, wherein the second material output pipeline is connected to the second storage tank, and a fourth valve is arranged on the second material output pipeline; and
        a main material output pipeline, wherein the main material output pipeline is connected to the first material output pipeline and the second material output pipeline, and a ninth valve, second pumps, flow meters and second filters are configured to be arranged on the main material output pipeline.

2. The material supply system according to claim 1, wherein the first storage tank and the second storage tank are two independent storage buckets.

3. The material supply system according to claim 1, wherein the gas channel comprises:
    a first gas input pipeline, wherein the first gas input pipeline is connected to the first storage tank, and a first valve is arranged on the first gas input pipeline; and
    a second gas input pipeline, wherein the second gas input pipeline is connected to the second storage tank, and a second valve is arranged on the second gas input pipeline.

4. The material supply system according to claim 1, wherein the material supply system further comprises:
    an exhaust channel, wherein the exhaust channel comprises a first exhaust pipeline and a second exhaust pipeline, and the first exhaust pipeline and the second exhaust pipeline are respectively connected to the first storage tank and the second storage tank.

5. The material supply system according to claim 1, wherein the material supply system further comprises:
    a liquid supplement channel, wherein the liquid supplement channel comprises a first liquid supplement pipeline and a second liquid supplement pipeline, and the first liquid supplement pipeline and the second liquid supplement pipeline are respectively connected to the first storage tank and the second storage tank.

6. The material supply system according to claim 5, wherein the liquid supplement channel further comprises:
    a main liquid supplement pipeline, wherein the main liquid supplement pipeline is connected to the first liquid supplement pipeline, and the main liquid supplement pipeline is connected to the second liquid supplement pipeline.

7. The material supply system according to claim 1, wherein the material supply system further comprises:
    a detection part, used to determine remaining quantity information of the supply material in the first storage tank and the second storage tank; and
    a control part, the control part is connected to the detection part to obtain the remaining quantity information through the detection part, and controls the material channel according to the remaining quantity information to be switched to connect with the first storage tank or the second storage tank.

8. The material supply system according to claim 4, wherein the material supply system further comprises:
    a liquid supplement channel, wherein the liquid supplement channel comprises a first liquid supplement pipeline and a second liquid supplement pipeline, and the first liquid supplement pipeline and the second liquid supplement pipeline are respectively connected to the first storage tank and the second storage tank.

* * * * *